United States Patent
Abe et al.

(10) Patent No.: US 8,303,722 B2
(45) Date of Patent: Nov. 6, 2012

(54) WATER AND METHOD FOR STORING SILICON WAFER

(75) Inventors: Tatsuo Abe, Fukushima (JP); Kenichi Kanazawa, Fukushima (JP); Akira Miyashita, Fukushima (JP); Norio Kashimura, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1909 days.

(21) Appl. No.: 10/276,483

(22) PCT Filed: Mar. 11, 2002

(86) PCT No.: PCT/JP02/02250
§ 371 (c)(1),
(2), (4) Date: Nov. 15, 2002

(87) PCT Pub. No.: WO02/075798
PCT Pub. Date: Sep. 26, 2002

(65) Prior Publication Data
US 2003/0139067 A1    Jul. 24, 2003

(30) Foreign Application Priority Data

Mar. 16, 2001 (JP) .................................. 2001-76118

(51) Int. Cl.
  *B08B 7/00* (2006.01)
  *B08B 3/00* (2006.01)
  *B08B 7/04* (2006.01)
(52) U.S. Cl. ............... 134/26; 134/30; 134/34; 134/902
(58) Field of Classification Search ............ 134/34, 134/26, 30, 902
See application file for complete search history.

(56) References Cited

U.S. PATENT DOCUMENTS

| | | | | |
|---|---|---|---|---|
| 4,883,775 A | * | 11/1989 | Kobayashi | 134/4 |
| 4,973,563 A | * | 11/1990 | Prigge et al. | 438/692 |
| 5,105,628 A | * | 4/1992 | Nakai | 62/78 |
| 5,484,748 A | * | 1/1996 | Suzuki et al. | 438/753 |
| 5,837,662 A | * | 11/1998 | Chai et al. | 510/175 |
| 5,857,474 A | * | 1/1999 | Sakai et al. | 134/102.3 |
| 5,863,808 A | * | 1/1999 | Tsunoda | 438/18 |
| 6,045,624 A | * | 4/2000 | Kamikawa et al. | 134/30 |
| 6,063,205 A | * | 5/2000 | Cooper et al. | 134/2 |
| 6,299,513 B1 | * | 10/2001 | Tsuihiji et al. | 451/88 |
| 6,573,201 B1 | * | 6/2003 | Ogure et al. | 118/50 |
| 6,833,109 B1 | | 12/2004 | Aoki et al. | |
| 6,884,721 B2 | * | 4/2005 | Fukami | 438/690 |
| 2003/0001183 A1 | * | 1/2003 | Noguchi et al. | 257/296 |

FOREIGN PATENT DOCUMENTS

| | | |
|---|---|---|
| EP | 5484748 A2 | 9/1995 |
| EP | 0926714 A1 | 6/1999 |
| GB | 2349741 A | 11/2000 |
| JP | 07-263403 | 10/1995 |
| JP | 08-083783 | 3/1996 |
| JP | 11-191543 | 7/1999 |
| JP | 11-243073 | 9/1999 |
| JP | 2000-049127 | 2/2000 |
| JP | 2000-049128 | 2/2000 |
| JP | 2000-091277 | 3/2000 |
| JP | 2000-277470 | 10/2000 |
| WO | 02/075798 | 9/2002 |

OTHER PUBLICATIONS

Certified translation of JP 07-263403.*
European Office Action for corresponding European application No. 02703960.1-1528.

* cited by examiner

*Primary Examiner* — Alexander Markoff
(74) *Attorney, Agent, or Firm* — Hogan Lovells US LLP

(57) ABSTRACT

There is provided a storage water of a silicon wafer wherein a liquid temperature of the storage water is 0 to 18° C. And there is provided a shower water of a silicon wafer wherein a liquid temperature of the shower water is 0 to 18° C. The wafer is stored in the storage water, and showered using the shower water. The present invention also relates to a method for storing silicon wafer wherein the silicon wafer is showered using a shower water of which liquid temperature is 0 to 18° C., and is then stored in liquid using a storage water of which liquid temperature is 0 to 18° C. Thereby, there can be provided a water for storing a silicon wafer, a method for storing it, a water for showering it and a method for showering it wherein degradation of the wafer quality can be prevented.

1 Claim, No Drawings

WATER AND METHOD FOR STORING SILICON WAFER

TECHNICAL FIELD

The present invention relates to a water for storing a silicon wafer (hereinafter occasionally referred to as "wafer") and a method for storing it; a water for showering a silicon wafer and a method for showering it; and a method for producing a silicon mirror wafer, especially to a water for storing in a water a silicon wafer of which surface state is active, immediately after a polishing step conducted in a manufacturing process of a silicon wafer, and a method for storing it or the like.

BACKGROUND TECHNOLOGY

Generally, a method for producing a silicon wafer comprises a slicing process wherein a single crystal ingot pulled by the Czochralski method or the like is sliced to provide a thin disk-like wafer, a chamfering process of chamfering the peripheral part of the wafer produced in the slicing process in order to prevent cracking and chipping, a lapping process of planarizing the wafer, an etching process of removing mechanical damages which remain on the wafer after being chamfered and lapped, a polishing process of making the surface of the wafer to be a mirror surface, and a cleaning process of cleaning the wafer to remove a polishing agent or foreign matter adhered on the wafer.

In the above-mentioned method for producing the silicon wafer, there were shown the main processes. There may be added the processes, such as a surface grinding process and a heat treatment process or the like. Moreover, the order of the processes may be changed, or the same processes may be repeated plural times in some cases.

Then, the wafer is subjected to inspection or the like, and is sent to a device manufacturing company (process), where an insulator layer or metal wiring is formed on the silicon wafer, to produce a device, such as memory.

In manufacture of a silicon wafer, there may sometimes arises waiting time between each of the processes before being supplied to the following process, because of capacity of the apparatus, trouble of the apparatus, or the like. In this case, it is necessary to store it by a method suitable for the condition of the silicon wafer. For example, there is a cleaning process as the following process after a polishing process, and the wafer is usually stored in water during the waiting time until it is transferred to the cleaning process. This is because, if the wafer is stored in the atmosphere, solidification of the slurry is caused as a result of dryness of a polishing slurry, which is difficult to be removed at the cleaning process as the following process.

Moreover, for example, in the case that the polishing process is conducted according to a wax mount method wherein the wafer is held on a holding plate with a wax and polished, there is a process wherein the wafer is peeled from the holding plate with pouring a shower water to the wafer after polishing. Moreover, showering of the wafer is conducted by pouring a shower water on the wafer, even if it is not conducted according to the wax mount method.

On the other hand, the need for improvement of the quality of a wafer has become still severer. For example, it has become necessary to pay attention fully to metal contamination and surface roughness on the surface of the wafer. For example, oxide dielectric breakdown voltage (GOI: Gate Oxide Integrity) and haze (HAZE: called micro roughness) or the like are measured as an item of wafer quality, and the wafer is determined whether it is good or not. Even if it is the wafer which is satisfactory in the present quality standard of the wafer, the yield may be lowered in a device manufacturing process or the like. There may be various reasons why yield is lowered even if the wafer satisfies a certain standard. It has turned out that it is influenced a lot especially by showering to the wafer and storage of the wafer in liquid after a polishing process, in a wafer manufacturing process. Since the surface of the wafer immediately after polishing is active, and thus the possibility that the influence of atmosphere, storage water or the like lead to degradation of wafer quality is large. Furthermore, since it is the last process of manufacture of the wafer, it is difficult to improve the quality of the wafer surface thereafter. On the other hand, it is indispensable to subject a silicon wafer to showering and storage in liquid in order to prevent solidification of a polishing slurry or the like. Therefore, it is necessary to pay attention fully to storing and showering immediately after polishing.

For this reason, each manufacturing process of a silicon wafer has been conventionally performed in a clean room where environmental condition such as air cleanliness, atmospheric pressure and temperature, was controlled and managed severely. In the clean room, the room temperature has been kept at 20 to 25° C., and storage water and shower water have also been controlled at a temperature of 20 to 25° C. However, there was a case where the quality of a wafer is degraded also under such control.

Although the cause of degradation of the wafer quality is not clear, it is considered to be slight roughened surface or slight metal contamination on the surface of the wafer caused by a storage water or a shower water, or other action on the surface of the wafer.

Therefore, it is required for a chemical liquid used for the storage (a storage water), or a shower water to have almost no etching effect. The chemical liquid used for cleaning or the like usually has an effect of etching a wafer surface slightly, and the surface condition of the wafer changes with time. Since storage time varies depending on the condition of the process when the wafer is stored in the storage water, there should be no influence by storage time in order to prevent variation and to maintain the same condition of the surface of the wafer.

Accordingly, there have been developed as a method for storing the wafer after polishing: a method of immersing it in hydrogen peroxide water to prevent contaminant on the surface of a wafer (Japanese Patent Application Laid-Open (Kokai) No. 7-263403), a method for storing it in a pure water which contains ozone in order to prevent deterioration of surface roughness (Japanese Patent Application Laid-Open (Kokai) No. 8-83783), a method of controlling metal (Cu) concentration in the storage water in order to prevent breakdown voltage failure (Japanese Patent Application Laid-Open (Kokai) No. 11-191543), a method of adding a chelating agent, in order to prevent breakdown voltage failure by metal contamination (Japanese Patent Application Laid-Open (Kokai) No. 11-243073), a method of using an electrolysis cathode water or an electrolysis anode water as a storage water in order to remove particles (Japanese Patent Application Laid-Open (Kokai) Nos. 2000-49127 and 2000-49128), and a method of adding surfactants or citric acid or the like.

By using the storage water as described above, it is possible to prevent metal contamination and to prevent deterioration of surface roughness, and to prevent degradation of the wafer quality such as an oxide dielectric breakdown voltage and haze to some extent. However, the wafer quality evaluated according to the following SC1 evaluation method may be varied in some cases, even if the above-mentioned storage water is used, and attention is paid to the cleanliness of shower water, and the environment in a clean room.

The SC1 evaluation method is a method of estimating a wafer quality by etching the surface of the wafer repeatedly (or for a long time) with a chemical liquid consisting of aqueous ammonia, hydrogen peroxide water, and water, actualizing the defects on the surface of the wafer, and then checking the number or the state of increase of LPD(s) (Light Point Defect) (called SC1-RT or SC1 long-time etching evaluation method or the like, hereinafter referred to as just "SC1 evaluation method").

It is known that, when evaluating according to this method, there will be detected defects in a wafer, COP (Crystal Originated Particles) which is a crystal defect mainly generated while a silicon ingot is grown, or a mechanical damage formed during processing, and defects due to external contamination sources such as metal. However, it is thought that defects other than them which influences wafer quality are detected with high sensitivity.

Specific cause of degradation of the wafer quality by storage water or shower water is unclear. However the difference between good products and failure products can be confirmed by above SC1 evaluation method.

DISCLOSURE OF THE INVENTION

The present invention has been made in order to solve such problems. The object of the present invention is to provide a method for storage and a method for showering of a silicon wafer, and a method for producing a silicon mirror wafer wherein degradation of the wafer quality is prevented, to be a grade which is satisfactory, especially evaluated by SC1 evaluation method, and management thereof is easy.

To achieve the above mentioned object, the present invention provides a storage water of a silicon wafer used for storing a silicon wafer in liquid wherein liquid temperature of storage water is 0 to 18° C. As described above, if a temperature of the storage water is lowered, compared with the temperature of 20 to 25° C. which is temperature of the storage water which has been conventionally used in a clean room, degradation of the wafer quality evaluated according to the SC1 evaluation method can be prevented.

The above-mentioned storage water is desirably pure water. The quality of the wafer can be stably kept by storing it in pure water with few impurities.

Furthermore, the storage water to which the substance having a chelate effect, an oxidizing agent, a surfactant or the like is added may be used in order to prevent metal contamination and roughening of the wafer surface. By using such a storage water, degradation of the wafer quality such as those evaluated by the SC1 evaluation method can be prevented, even if the storage water include metal contamination. Moreover, etching due to the polishing agent remained on the wafer or the like can also be prevented. As a result, the wafer can be maintained more stably without lowering the wafer quality such as an oxide dielectric breakdown voltage and haze.

As described above, degradation of the wafer quality such as those evaluated by the SC1 evaluation method can be prevented by controlling the storage water in which the wafer is stored so that the temperature is lower than a temperature of the storage water usually used.

Such a method for storage is preferable especially in the case that the silicon wafer in the state where silicon is exposed on the surface of the silicon wafer is stored. For example, the silicon wafer in the state where silicon is exposed on the silicon wafer surface is a wafer immediately after polished in a polishing process, having a bare silicon surface (the state where silicon is exposed) wherein neither an insulator film nor other films are formed on their surface. The surface of the wafer immediately after polished is quite active, and apt to suffer from roughening of the surface and adsorb metal or the like, namely is apt to be influenced by atmosphere.

Hereupon, there have been also developed a technology (Japanese Patent Application Laid-Open (Kokai) No. 2000-277470) wherein a wafer is stored using pure water of which temperature is such that a reaction rate of a chemical reaction wherein an oxidizing agent contained in a polishing agent corrodes metal wiring may be reduced, for storing a wafer after polishing an excessive metal by chemical mechanical polishing in a device manufacturing process. The wafer stored according to the present invention is a silicon wafer, which has a surface in the state where metal wiring or the like is not formed on their surface. Accordingly, the chemical action thereof is completely different from the above.

Moreover, the present invention relates to a water for showering a silicon wafer wherein liquid temperature thereof is 0 to 18° C.

As described above, if a temperature of the shower water is lowered to the temperature of 0 to 18° C. which is refrigerated lower than the temperature of 20 to 25° C. temperature of the shower water which has been conventionally used in a clean room, generation of the defects on the surface of the wafer can be prevented.

In this case, the above-mentioned shower water is desirably pure water.

When the cooled pure water with few impurities is used, the wafer is prevented from being contaminated by the shower water, and defects evaluated by the SC1 evaluation method can be reduced.

Furthermore, the present invention relates to a method of showering a silicon wafer wherein showering of the silicon wafer is conducted using the shower water of the present invention as a shower water.

As described above, if a silicon wafer is showered with the shower water of the present invention, degradation of the wafer quality evaluated by the SC1 evaluation method can be effectively prevented.

The method for showering a silicon wafer is preferable especially in the case that the silicon wafer in the state where silicon is exposed on the silicon wafer surface is showered. For example, it is the wafer immediately after polishing in a polishing process, having a bare silicon surface wherein neither an insulator film nor other films are formed on their surface. The surface of the wafer immediately after polished is quite active, and apt to suffer from roughening of the surface and adsorb metal or the like, namely is apt to be influenced by atmosphere.

Moreover, the present invention relates to a method for storing a silicon wafer wherein the silicon wafer is showered using a shower water of which liquid temperature is 0 to 18° C., and is then stored in a liquid using a storage water of which liquid temperature is 0 to 18° C.

The wax for fixation or the like can be removed with suppressing generation of defects, by showering the silicon wafer using the shower water of which temperature is 0 to 18° C. which is lower compared with the conventional method, as described above. Moreover, when it is then stored in liquid using a storage water of which temperature is 0 to 18° C., which is lower compared with those conventionally used, the silicon wafer can be stored in liquid with suppressing generation of defects.

Furthermore, the present invention relates to a method for producing a silicon mirror wafer comprising at least a step of polishing the silicon wafer so that the polished surface may be a mirror surface, a step of storing the mirror surface silicon wafer in a storage water of which liquid temperature is kept at 0 to 18° C., and a step of cleaning the stored silicon wafer.

As described above, if the wafer between the end of the polishing process and the beginning of the cleaning process is stored in a storage water of which temperature is 0 to 18° C. which is lower than the temperature of 20 to 25° C. which is a temperature of the storage water managed and controlled in the conventional clean room, degradation of the wafer quality evaluated according to the SC1 evaluation method can be effectively prevented.

In this case, the wafer is subjected to the process of showering using the shower water of which liquid temperature is kept at 0 to 18° C. after the process of polishing the silicon wafer so that the polished surface may be mirror surface, and then the mirror polished wafer is subjected to the process of storing in the storage water of which liquid temperature is kept at 0 to 18° C.

The wax for fixation, a slurry of a polishing agent or the like can be effectively removed with suppressing generation of defects such as those evaluated by the SC1 evaluation method, by showering the wafer using the shower water of which liquid temperature is kept at 0 to 18° C. which is lower compared with the shower water used in the conventional method, as described above.

As described above, a silicon mirror wafer can be produced with storing and showering the wafer without degrading the quality of the surface of the wafer, according to the present invention. Especially, the subtle wafer quality which can not be detected by evaluation of an oxide dielectric breakdown voltage or haze (very subtle wafer quality such as those observed by the SC1 evaluation method) can not be stably maintained in the good state. Moreover, the storage water and the shower water can be managed easily.

BEST MODE FOR CARRYING OUT THE INVENTION

The embodiment of the present invention will be explained below.

The storage water or the shower water used for the present invention is a storage water or a shower water which mainly consists of pure water (ultrapure water) wherein the liquid temperature is 0 to 18° C. which is lower than temperature of the storage water and the shower water conventionally used in the clean room which is 20 to 25° C. In order to stabilize the wafer quality, it is desirable to make the temperature of the storage water or the shower water as low as possible. Accordingly, considering the temperature at which ultrapure water is not frozen and the performance of a heat exchanger (refrigerator) or the like, the temperature is preferably 0° C. or more, more preferably 10° C. or more. The upper limit is 18° C., more preferably low temperature as 16° C. or less in consideration of the range wherein the wafer quality is stable. If the temperature is higher than it, possibility that the quality may be degraded by storage or shower for a long time will become large, even if the pure water is used.

Furthermore, there may be added to the storage water or the shower water various additives which have been conventionally used in order to prevent metal contamination, roughening of the surface, or the like, in addition to the pure water.

For example, an oxidizing agent may be added to the storage water. Although an oxidizing agent is not limited, it is preferably those which makes a surface hydrophilic and prevents adhesion of a particle or the like. For example, hydrogen peroxide water, ozone water, or the like which have been conventionally used, can be used. In this case, concentration of 0.01 to 30% by weight in the case of hydrogen peroxide water and ozone concentration of 0.5 ppm or more in the case of ozone water are preferable to prevent deterioration of a surface roughness (haze) or the like efficiently.

Furthermore, the substance having a chelate effect can be added to the storage water. The substance having a chelate effect-is preferably the substance which can prevent metal contamination to a wafer surface, without being limited thereto. For example, it is preferably the chelating agent having a very high chelate generation ability such as NTA (nitro triacetic acid) and EDTA (ethylenediamine tetraacetic acid) or the like or the substance having a chelate effect at the acidic side such as citric acid or the like. Depending on the degree of metal contamination of the storage water, degradation of the wafer quality, especially such as lowering of an oxide dielectric breakdown voltage can be prevented by adding the chelating agents having a high chelate generation ability such as EDTA in an amount of 0.05 mol/l or more, or citric acid in an amount of 0.0001 to 0.1% by weight.

Furthermore, a surfactant may be added to the storage water. When it was stored in the pure water of ordinary temperature for a long time, roughening of the surface is sometimes caused. In order to prevent it, it is effective to add a surfactant. Although roughening of the surface hardly occurs with the pure water wherein liquid temperature is low as 0 to 18° C., roughening of the surface can be more effectively suppressed by addition of a surfactant. Although a surfactant will not be limited as far as the surface of the wafer is protected, it is preferably nonionic surfactants, such as polyoxyalkylene alkyl ether. If the surfactant is added at a concentration of about 0.01 to 0.1% by volume (correctly critical micelle concentration or more), roughening of the surface (deterioration of haze) and adhesion of particles can be prevented effectively.

A chelating agent such as NTA may easily cause roughening of the surface, since has a small solubility to pure water, and it is sometimes dissolved with an aqueous ammonium or the like, which may result in producing an alkaline storage water. Accordingly, it may be added together with an additive which prevents roughening of the surface such as a surfactant or the like. Moreover, storage using the storage water is preferably conducted in acidic to neutral condition. When citric acid is added, deterioration of surface roughness, an oxide dielectric breakdown voltage or the like can also be prevented, since it is acidic and has a chelate effect. Moreover, citric acid and a surfactant can also be used together.

As described above, even if the storage water and the shower water used conventionally is used, the wafer can be stored with further stable quality by storing the wafer with controlling liquid temperature at 0 to 18° C.

The pure water used for the storage water or the shower water of the present invention may be produced by a general ultrapure water system. Although the cooling method is not limited, there can be used a cooling system such as those comprising heat exchange with a chilling water (water mixed with ice) or a refrigerant in the ultrapure water system, or a temperature can be controlled by providing cooling means in a storage container (a storage bath) for the storage water or in the outflow path of a shower water.

In a storage container, there are provided a supply means (feed pipe or the like) for supplying the storage water and a water drainage means for discharging it (drainage pipe or the like). The storage water can be supplied continuously (an overflow method) or exchanged periodically (a batch method).

Such a storage container is arranged after a polishing process and before a cleaning process. Various polishing apparatuses are used at the polishing process, and it is not limited in the present invention. One example of a position where a storage container is installed is as follows: for example, the storage container is provided after the wafer is peeled from the holding plate in the polishing apparatus according to a wax mount method wherein the wafer is adhered and held on the holding plate. Plural wafers are put in a wafer receiving cassette and immersed in the storage water.

Furthermore, when the wafer is peeled from a holding plate in the polishing apparatus as above according to the wax mount method, generation of defects which can be detected by SC1 evaluation method can be prevented effectively with removing an a polishing agent by showering the wafer using the shower water of the present invention. Of course, generation of defects can also be prevented effectively by showering the wafer using the shower water of the present invention, and then storing the wafer in the storage water having liquid temperature of 0 to 18° C.

Alternatively, in not only the case of polishing by the above wax mount method, but in the case of polishing according to other methods, generation of defects can also be prevented by showering the silicon wafer using the shower water having liquid temperature of 0 to 18° C., and then storing the silicon wafer in liquid using the storage water having liquid temperature of 0 to 18° C. The same effect can be acquired even if the wafer is cleaned after showering, without being stored in liquid.

The present invention will be specifically explained hereunder by the following examples. The examples are only for exemplification, and not intended to limit the scope of the present invention.

Experiment conditions: P type silicon wafers with crystal orientation <100> and with a diameter of 200 mm (8 inches) were prepared as sample wafers. These sample wafers were prepared by mirror-polishing the wafers after subjecting an ingot pulled in such a method that defects such as COP are decreased as much as possible to a series of processes as generally performed. In the final polishing process, sample wafers were adhered on a holding plate with a wax, and one main surface of the sample wafers were polished using a polishing pad made of a foamed urethane resin and a colloidal silica polishing agent (pH=10.5) to which a surfactant was added under the following condition: a polishing load (250 g/cm$^2$) and polishing time (10 min).

After conducting polishing as described above, the sample wafers were peeled from the holding plate and stored in the storage water until being sent to the cleaning process as the following process.

EXAMPLE 1

As a storage container, a bath made of quartz glass having a size of 320×600×280 (mm$^3$) was used. A pure water was supplied through a pure water feed pipe at a bottom of the container, and discharged from the upper part of the container. The wafers were stored therein using a pure water as a storage water with keeping liquid temperature was kept at 16° C. The temperature of the pure water was controlled by a cooling system with a chilling water, and the pure water was supplied to the above-mentioned storage container at a flow rate of 5 l/min. (overflow method).

COMPARATIVE EXAMPLE 1

The wafers were stored using the pure water as a storage water, with controlling liquid temperature thereof at 25° C. which is ordinary temperature. It was stored with overflowing the water to a storage container at a rate of 5 l/min like in a similar way to Example 1.

The above-mentioned sample wafers were stored in the water for 1, 2, 4, and 8 or 12 hours, and the sample wafers were cleaned after stored. Cleaning was conducted according to a general cleaning method using a SC1 solution (liquid temperature of 80° C.) for cleaning comprising 28% by weight aqueous ammonia, 30% by weight hydrogen peroxide water and pure water at a ratio of 1:1:10 for 5 minutes, and then cleaned using SC2 solution (liquid temperature of 80° C.) comprising 36% by weight hydrochloric acid, 30% by weight hydrogen peroxide water, and pure water at a ratio of 1:1:20 for 5 minutes.

Haze and oxide dielectric breakdown voltage (GOI) were confirmed as a quality of the resultant wafer. Haze shows a surface roughness of the wafer, and judgment whether the wafer quality is good or bad can be conducted thereby. GOI is one of the most important parameters for evaluation of the wafer quality (reliability of an insulator film), and judgment whether the wafer quality is good or bad can be conducted thereby.

In evaluation of haze, measurement was conducted by haze mode of LS-6030 (manufactured by Hitachi Electronics Engineering Corporation). The larger evaluation value (bit) means a coarser surface.

GOI evaluation was conducted by forming on a wafer MOS capacitor of which thickness of gate oxide film which is an insulator film is 25 nm. Evaluation of oxide dielectric breakdown voltage was conducted by the method of applying stepwise the electric field to the above-mentioned MOS capacitor and measuring the dielectric breakdown electric field strength of the above-mentioned MOS capacitor (electric-field destructive distribution: TZDB method; Time Zero Dielectric Breakdown), and by the method of applying a certain electric field and measuring the rate that the above-mentioned MOS capacitor is destroyed with elapse of time with varying the strength of an electric field (a distribution of destruction with elapse of time TDDB method; Time Dependent Dielectric Breakdown).

The results of measurement by the TZDB method are represented by A mode where a dielectric breakdown due to initial short circuit is caused, B mode where a dielectric breakdown is caused at an electric field strength of 1 MV/cm to 8 MV/cm, and C mode (good chip) where it is reached to a certain electric field without being destroyed (dielectric breakdown is 8 MV/cm or more). In this Example and Comparative example, it was performed with a current density in decision of 1 mA/cm$^2$ and a gate area of 8 mm$^2$.

The measurement result of the TDDB method is similarly expressed in α mode (fail chip) where insulation failure is caused in early stage, β mode (semi-good chip) where a dielectric breakdown is caused in the range where total amount of flown charges is smaller than 5 C/cm$^2$, and γ mode (good chip) where a dielectric breakdown is not caused (dielectric breakdown is caused in the range of 5 C/cm$^2$ or more). Evaluation of the wafers stored in the storage water of Example 1 and Comparative example 1 were conducted under the following condition: stress electric current value is 1 mA/cm$^2$, measurement temperature is 100° C., and a gate area is 4 mm$^2$. On both TZDB and TDDB, 100 chips of the MOS capacitor per wafer were formed, and the yield in each mode was evaluated.

The results of evaluation of haze were shown in Table 1. The smaller value of the results of evaluation means smaller surface roughness (good). The larger value of the result of evaluation means larger surface roughness (bad). In this example, deterioration of haze is hardly observed in both Example 1 and Comparative example 1. Deterioration of haze may be seen sometimes when a wafer is stored using only the pure water of ordinary temperature. The haze of the sample wafers used in this examples were about 40 (bit), and even if they were stored for a long time, deterioration of the haze due to pure water was not seen. This is because it was stored in a state that the wafer surface had been protected by a surfactant contained in a polishing agent.

TABLE 1

Haze evaluation result

| Storage Time | 1 hour | 2 hours | 4 hours | 8 hours | 12 hours |
|---|---|---|---|---|---|
| Example 1 | 41 | 40 | 41 | 41 | 41 |
| Comparative Example 1 | 41 | 41 | 41 | 42 | 41 |

Unit: Bit (measurement result by LS6030 manufactured by Hitachi Electronics Engineering)

The results of the GOI evaluation were shown in Table 2. The rate of C mode (a rate of a good chip) of TZDB of the wafers stored in each of the storage water and the rate of $\alpha$, $\beta$, $\gamma$ mode of TDDB were shown in the results of GOI evaluation. Although the same state was maintained for a long time in Example 1, the rate of C mode (good chip) of TZDB or $\gamma$ mode (good chip) of TDDB was decreased gradually in Comparative example 1. When a wafer is stored only with the pure water of ordinary temperature, deterioration of an oxide dielectric breakdown voltage may be sometimes seen. As for the sample wafers used this time, degradation of quality was not seen so greatly. The reason is considered to be that there is almost no contamination of metal from the outside or the like and the wafers were stored in the state of high purity.

TABLE 2

GOI evaluation result
Example 1

| Storage time | 1 hour | 2 hours | 4 hours | 8 hours | 12 hours |
|---|---|---|---|---|---|
| TZDB C mode (%) | 71.0 | 69.0 | 70.0 | 72.0 | 71.0 |
| TDDB | | | | | |
| $\alpha$ mode (%) | 16.0 | 17.0 | 16.0 | 19.0 | 18.0 |
| $\beta$ mode (%) | 2.0 | 1.0 | 1.0 | 1.0 | 1.0 |
| $\gamma$ mode (%) | 82.0 | 82.0 | 83.0 | 80.0 | 81.0 |

Comparative example 1

| Storage Time | 1 hour | 2 hours | 4 hours | 8 hours | 12 hours |
|---|---|---|---|---|---|
| TZDB C mode (%) | 71.0 | 70.0 | 69.0 | 67.0 | 68.0 |
| TDDB | | | | | |
| $\alpha$ mode (%) | 17.0 | 17.0 | 18.0 | 23.0 | 24.0 |
| $\beta$ mode (%) | 2.0 | 1.0 | 1.0 | 3.0 | 6.0 |
| $\gamma$ mode (%) | 81.0 | 82.0 | 81.0 | 74.0 | 70.0 |

Furthermore, the wafer quality was evaluated by SC1 evaluation method. This is because the difference of wafer quality may not be seen so notably in evaluation of haze or an oxide dielectric breakdown voltage as mentioned above. It is for observing by SC1 evaluation method the difference of wafer quality which has become clear neither by evaluation of an oxide dielectric breakdown voltage nor by evaluation of haze.

Specifically, the processing container used for SC1 evaluation method was cleaned with acid solutions, such as hydrochloric acid, then SC1 liquid for evaluation (treatment liquid) was prepared by formulating 28% by weight aqueous ammonia, 30% by weight hydrogen peroxide water and pure water at the ratio of 10:2:100 and put into the processing container. The treatment liquid was kept at 80° C., and the sample wafers polished previously were immersed into the liquid and etched for 40 minutes. Then, they were rinsed with pure water and dried with IPA, and then the number of LPD of 0.12 µm or more on the wafers were counted by particle counter LS-6500 (made by Hitachi Electronics Engineering Corp.). The number of LPD was hereinafter shown as an average of two or more of evaluated wafers.

The results are shown in Table 3. When the storage water of Example 1 was used, the LPD number was about 90. Even when the storage time was changed, the LPD number did not change so much and was in the stable level. On the other hand, in the case of Comparative example 1, although a LPD number was 95 at the beginning of the storage, it was increased as the storage time becomes long, and increased to 185 at the time of 12 hours, which was almost twice. This means that the wafer quality was degraded.

Since GOI evaluation and SC1 evaluation method were destructive inspections, two or more wafers required for each evaluation criteria were treated for every storage conditions in Example 1 and Comparative example 1. Also in other Examples and the Comparative examples described below, plural wafers were treated under the same conditions, when it is an example wherein evaluation of two or more items are conducted.

TABLE 3

Evaluation result by SC1 evaluation method
(the number of LPD)

| Storage Time | 1 hour | 2 hours | 4 hours | 8 hours | 12 hours |
|---|---|---|---|---|---|
| Example 1 | 80 | 102 | 95 | 85 | 89 |
| Comparative Example 1 | 95 | 112 | 108 | 135 | 185 |

Unit: Number/8 inch wafer

The sample wafers used this time were cleaned immediately after being polished without being immersed in the storage water. The numbers of LPD detected in the evaluation under the evaluation condition this time was in the range of 80 to 100, and never exceeded 120. If degradation of the wafer quality is not caused by the storage water, this level may be maintained after being immersed in the storage water. If the number of the observed LPD was more than the value, it was shown that the wafer quality was degraded. It can be seen that the results of Comparative example 1 was influenced by high temperature of the storage water.

EXAMPLES 2-4, COMPARATIVE EXAMPLES 2-4

Then, under the same condition of Example 1, evaluation was conducted with controlling the temperature of the storage water at 10° C. (Example 2), 13° C. (Example 3), 18° C.

(Example 4), 20° C. (Comparative example 2), 30° C. (Comparative example 3), and 40° C. (Comparative example 4), and evaluation by SC1 evaluation method was conducted. The Storage time was 12 hours.

As a result, the LPD numbers were 85 in Example 2, 82 in Example 3, and 88 in Example 4. There was also almost no variation between the wafers stored under these conditions. On the other hand, it was 119 in Comparative example 2, 212 in Comparative example 3 and 245 in Comparative example 4. The results shows clearly that the quality of the wafer was degraded more as temperature of the storage water becomes higher. Moreover, the variation between plural wafers evaluated also became large with elevation of the temperature, as there are wafers of which LPD number was increased and wafers which was not so, at nearly 20° C. or higher. Thus, it is required to control the temperature at least 18° C. or less, preferably 16° C. or less in order to maintain the wafer quality stably, since the LPD number increases bordering on about 20° C. as described above.

EXAMPLE 5

An oxidizing agent was added to the storage water. Hydrogen peroxide water was used as an oxidizing agent. The pure water wherein a concentration of hydrogen peroxide was 1.0% by weight was used as the storage water. This storage water was kept at low temperature as 16° C., and the sample wafers similar to the above were immersed therein and stored for 12 hours with supplying the water by overflow method at a rate of 2 l/min. As a result, the number of LPD was 88 in evaluation by the SC1 evaluation method, namely ordinary level had been maintained.

COMPARATIVE EXAMPLE 5

The sample wafers were stored under the same conditions as Example 5 except that the temperature of the storage water was ordinary temperature (25° C.). The number of LPD was 153 in evaluation by the SC1 evaluation method. Although it was better than the result when the wafer was stored in only pure water as in Comparative example 1, degradation of the wafer quality can be observed, when compared with Example 5. In addition, when the haze was evaluated in Example 5, it was 40 to 41 (bit). Namely, the excellent level had been maintained.

EXAMPLE 6

A substance having a chelate effect was added to the storage water. The storage water prepared by adding citric acid as substance having a chelate effect to a pure water so that the concentration might be 0.005% by weight was used (pH=4.1 at this time). The storage water was kept at a low temperature as 16° C., and the sample wafers were immersed therein and store for 12 hours in the state of pit water (batch processing). As a result, the number of LPD was 83 in the SC1 evaluation method.

COMPARATIVE EXAMPLE 6

The sample wafers were kept under the same conditions as Example 6 except that the temperature of the storage water was ordinary temperature (25° C.). In evaluation by the SC1 evaluation method, the number of LPD was 149, and degradation of the wafer quality can be observed, when compared with Example 6. In addition, when the haze was evaluated in Example 6, it was 40 to 41 (bit). Moreover, γ mode of TDDB of oxide dielectric breakdown voltage was also maintained at 80%.

EXAMPLE 7

A surfactant was added to the storage water. The storage water prepared by adding NCW601 manufactured by Wako Pure Chemical Industries Ltd. as a surfactant to pure water so that the concentration might be 0.01% by weight was used. The storage water was kept at a low temperature as 16° C., and the sample wafers were immersed therein and store for 12 hours in the state of pit water (batch processing). As a result, the number of LPD was 89 in the SC1 evaluation method, namely it was excellent.

COMPARATIVE EXAMPLE 7

The sample wafers were kept under the same conditions as Example 7 except that the temperature of the storage water was ordinary temperature (25° C.). In evaluation by the SC1 evaluation method, the number of LPD was 146, and degradation of the wafer quality can be observed, when compared with Example 7. In addition, when the haze was evaluated in Example 7, it was 40 to 41 (bit). Namely, the good state had been maintained. Moreover, a particle level was also good.

As described above, not only in the case of pure water, but in the case of the storage water to which an oxidizing agent or the like was added, the wafer can be stored stably by keeping liquid temperature of the storage water at 18° C. or less. Although the additives as the above are not necessarily required for the process where there is almost no contamination as in Example 1 or Comparative example 1, it is desirable to add the above additives in order to prevent haze or lowering of oxide dielectric breakdown voltage effectively.

As described above, the wafer quality can be stably maintained by keeping a liquid temperature of the storage water at low temperature. Moreover, since control of temperature is relatively easy, management of the storage water is also simple.

EXAMPLE 8

The silicon wafers same as the wafer of Example 1 were prepared as sample wafers. However, in Example 8, the sample wafers were fixed on the holding plate with the wax in the final polishing process and one main surface of the sample wafers was polished. Then, they were removed from the holding plate, with showering the silicon wafers with the shower water of which liquid temperature was 16° C. The number of LPD of the wafer was evaluated by the SC1 evaluation method. As a result, 77 of LPDs were detected in the surface of the wafer, which was a good result.

COMPARATIVE EXAMPLE 8

LPD of the silicon wafers immediately after polishing was evaluated by the SC1 evaluation method as in Example 8. However, in Comparative example 8, the sample wafers were fixed on the holding plate with the wax in the final polishing process and one main surface of the sample wafers was polished. Then, they were peeled from the holding plate with showering the silicon wafers with the shower water of which liquid temperature was 25° C. The number of LPD of the wafer was evaluated by the SC1 evaluation method. As a result, 89 of LPDs were detected in the surface of the wafer, and degradation of the wafer quality can be observed, when compared with Example 8.

As described above, degradation of the wafer quality can be prevented by making a liquid temperature of the shower water at low temperature as 18° C. or less. It suggests that the initial value of the defects of the wafer which will be then stored can be reduced by using the cooled shower water for the wafer immediately after polishing at which the surface of the wafer is the most active. Moreover, since control of temperature of the shower water is relatively easy, management of liquid temperature of the shower water is also easy.

EXAMPLE 9

The sample wafers showered with the shower water of which liquid temperature was 16° C. immediately after the polishing as Example 8 were stored using a pure water as a storage water in the same way as Example 1, with controlling the liquid temperature at 16° C. Each of the sample wafers was stored in the storage water with varying the storage time as 1, 2, 4, 8 or 12 hours, followed by the same cleaning process of the sample wafer as described in Example 1. As for each of the wafers stored for each storage time, the number of LPD was evaluated by the SC1evaluation method.

The results of evaluation were shown in Table 4 together with the number of LPD in the wafer immediately after polishing of Example 8. As shown in Table 4, as for the wafer stored by the method of Example 9, the number of LPD was few immediately after polishing, and the wafer quality was not degraded much even when it was stored for a prolonged storage time. Namely, the wafer quality can be maintained at a high level, and degradation can be suppressed by showering the mirror surface silicon wafer after the mirror polishing with the shower water of which liquid temperature was kept at 0 to 18° C., then being stored using the storage water of which liquid temperature was kept at 0 to 18° C., and then sending to a cleaning process.

TABLE 4

Evaluation results by SC1 evaluation method (LPD number)

| Storage time | 0 hour | 1 hour | 2 hours | 4 hours | 8 hours | 12 hours |
| --- | --- | --- | --- | --- | --- | --- |
| Example 9 | 77 | 78 | 82 | 78 | 82 | 80 |
| Comparative example 9 | 89 | 107 | 124 | 120 | 147 | 202 |

Unit: number/8 inch wafer

COMPARATIVE EXAMPLE 9

The sample wafers showered with the shower water of which liquid temperature was 25° C. immediately after the polishing as Comparative example 8 were stored using a pure water as a storage water in the same way as Comparative example 1, with controlling the liquid temperature at 25° C. Each of the sample wafers was stored in the storage water with varying the storage time as 1, 2, 4, 8 or 12 hours, followed by the same cleaning process of the sample wafers as described in Example 1. As for each of the wafers stored for each storage time, the number of LPD was evaluated by the SC1 evaluation method.

The results of the evaluation were shown in Table 4 together with the number of LPD in the wafer immediately after polishing of Comparative example 8. As shown in Table 4, as for the wafer stored by the method of Comparative example 9, the number of LPD was many immediately after polishing, and degradation of the wafer quality was larger with longer storage time in liquid. Namely, the wafer quality was significantly degraded in the case that the mirror surface silicon wafer after the mirror polishing was showered with the shower water of which liquid temperature was kept at about 25° C., as in the conventional method, stored using the storage water of which liquid temperature was kept at about 25° C., and then sending to a cleaning process.

The present invention is not limited to the above described embodiment. Although the storage time was 12 hours at most in the above examples of the present invention, the storage time in the storage water may be varied depending on circumstance of the processes. According to the storage water or the method for storage of the present invention, stable storage is enabled irrespective of the storage time.

Moreover, the storage water, the shower water and the method for storage, and a method for showering can be similarly applied to, in addition to the wafer immediately after a polishing process, the wafer after an etching process, a surface grinding process, HF treatment, and furthermore, the wafer after epitaxial growth, as far as it is storage or shower of the wafer on which bare silicon is exposed.

The invention claimed is:

1. A method for storing a silicon wafer, comprising, after polishing a silicon wafer so that a polished surface thereof becomes a mirror surface where silicon is exposed, showering the silicon-exposed silicon wafer using a shower water of which liquid temperature is 0 to 18° C., and thereafter storing the silicon-exposed silicon wafer in a storage water consisting of ultrapure water of which liquid temperature is 0 to 18° C.

* * * * *